United States Patent
Yoshii et al.

(10) Patent No.: US 6,909,175 B2
(45) Date of Patent: Jun. 21, 2005

(54) EL DEVICE SEALING PLATE, MULTIPLE SEALING PLATE-PRODUCING MOTHER GLASS SUBSTRATE, AND EL DEVICE

(75) Inventors: Tetsuro Yoshii, Tokyo (JP); Hiroshi Nishikawa, Tokyo (JP)

(73) Assignee: Nippon Sheet Glass Co., Ltd., Osaka (JP)

(*) Notice: Subject to any disclaimer, the term of this patent is extended or adjusted under 35 U.S.C. 154(b) by 0 days.

(21) Appl. No.: 10/460,828

(22) Filed: Jun. 12, 2003

(65) Prior Publication Data
US 2003/0230795 A1 Dec. 18, 2003

(30) Foreign Application Priority Data
Jun. 14, 2002 (JP) .................................. 2002-174480

(51) Int. Cl.[7] .............................................. H01L 23/12
(52) U.S. Cl. ...................... 257/704; 257/433; 257/707; 257/710; 257/730; 257/794
(58) Field of Search .................. 257/81, 82, 431–444, 257/451, 723, 724, 777, 500, 613, 433, 704, 707, 710, 730, 794

(56) References Cited

U.S. PATENT DOCUMENTS

| | | | | |
|---|---|---|---|---|
| 5,130,531 A | * | 7/1992 | Ito et al. ................ | 250/216 |
| 5,535,231 A | * | 7/1996 | Lee et al. ................ | 372/50 |
| 6,441,402 B2 | * | 8/2002 | Nakanishi et al. ......... | 257/81 |

FOREIGN PATENT DOCUMENTS

| | | |
|---|---|---|
| JP | 10-172757 A | 6/1998 |
| JP | 11-040354 A | 2/1999 |
| JP | 2000-156287 A | 6/2000 |
| JP | 2000-195662 A | 7/2000 |
| JP | 2000-260562 A | 9/2000 |
| JP | 2001-092376 A | 4/2001 |
| JP | 2001-167875 A | 6/2001 |
| JP | 2001-176655 A | 6/2001 |

* cited by examiner

Primary Examiner—Long Pham
Assistant Examiner—Wai-Sing Louie
(74) Attorney, Agent, or Firm—Cohen, Pontani, Lieberman & Pavane

(57) ABSTRACT

There is provided an EL device which has sufficient strength to external pressure and is capable of effectively preventing moisture and oxygen from infiltrating into the EL device, thereby having a prolonged life. An organic EL device 200 is comprised of a substrate 1, an organic EL multilayer film 2 that is formed on the substrate 1, and a sealing plate 31 that is bonded onto the substrate 1 using an adhesive 4 so as to cover the organic EL multilayer film 2. The sealing plate 31 is of a flangeless type, wherein the width of peripheral projecting parts thereof is not less than the thickness at these peripheral projecting parts, and moreover is not less than 0.7 mm.

7 Claims, 4 Drawing Sheets

EL DEVICE SEALING PLATE, MULTIPLE SEALING PLATE-PRODUCING MOTHER GLASS SUBSTRATE, AND EL DEVICE

BACKGROUND OF THE INVENTION

1. Field of the Invention

The present invention relates to an EL (electroluminescent) device sealing plate, a multiple sealing plate-producing mother glass substrate for producing a plurality of the EL device sealing plates, and an EL device, and in particular to a flangeless EL device sealing plate that has peripheral projecting parts and covers an EL multilayer film formed on an EL device substrate, a multiple sealing plate-producing mother glass substrate for producing a plurality of the EL device sealing plates, and an EL device.

2. Description of the Related Art

An EL device is generally constituted from a transparent substrate, an EL multilayer film formed on the substrate, and an EL device sealing plate that is joined to the substrate by a joining material or the like so as to hermetically cover the EL multilayer film.

In an EL device of first prior art as proposed, for example, in Japanese Laid-open Patent Publication (Kokai) No. 2000-156287, Japanese Laid-open Patent Publication (Kokai) No. 2000-195662, Japanese Laid-open Patent Publication (Kokai) No. 2000-260562, Japanese Laid-open Patent Publication (Kokai) No. 2001-167875, and Japanese Laid-open Patent Publication (Kokai) No. 2001-176655, an adsorbing agent that adsorbs moisture and oxygen is disposed in a space in which an EL multilayer film is sealed to adsorb moisture and oxygen that constantly infiltrates into this space from the outside.

Moreover, in an EL device of second prior art as proposed in Japanese Laid-open Patent Publication (Kokai) No. 11-40354, a protective film is provided on the EL multilayer film itself.

Furthermore, in an EL device of third prior art as proposed in Japanese Laid-open Patent Publication (Kokai) No. 10-172757, an EL multilayer film is sealed in by disposing a low-melting-point metal around the outer periphery of parts to be joined and then melting the low-melting-point metal; in an EL device of fourth prior art as proposed in Japanese Laid-open Patent Publication (Kokai) No. 2001-92376, an EL multilayer film is sealed in by disposing a metal such as Cr around the outer periphery of parts to be joined, and then momentarily heating the metal using laser light to melt and thus join the parts to be joined. Moreover, there have also been proposed EL devices in which spacers or the like are interposed between parts to be joined, and then joining is carried out including the spacers, thus sealing in an EL multilayer film.

As described above, the first to fourth prior art is all art for resolving the problem of an EL multilayer film deteriorating due to moisture and oxygen that infiltrates in from the outside of an EL device.

On the other hand, an EL device sealing plate may be made of a metal, a glass, a resin, and so on. In the case of a glass EL device sealing plate, methods of processing a starting material glass plate into a recessed shape to produce the glass EL device sealing plate include a pressing method in which the starting material glass plate itself is bent, and a sandblasting method and an etching method in which a central part of the starting material glass plate is removed. In the sandblasting method or the etching method, peripheral parts of the starting material glass plate are masked, and then the central part is sandblasted or etched to form a recessed part in the central part.

However, with the first to fourth prior art described above, although infiltration of moisture and oxygen into the EL device can be prevented, no consideration is given to the area of the parts of the sealing plate to be joined to the substrate in the EL device, and this area may be insufficient.

Moreover, with the pressing method described above, parts of the sealing plate that contact the substrate of the EL device in which the sealing plate is used, i.e. parts that are joined to the substrate, are flange-shaped, and hence the area thereof can be made sufficiently high, but these parts have a low degree of flatness, and hence when these parts are joined to the substrate using an adhesive when manufacturing the EL device, the thickness of the adhesive is not uniform, and thus moisture and oxygen are liable to infiltrate into the EL device via these joining parts.

Furthermore, with the sandblasting method described above, a large number of minute cracks that are inherent in the sandblasting method arise in the sealing plate, and hence the strength of the sealing plate drops. In particular, in the case that the EL device in which the sealing plate is used is a top emission type EL device for use in a mobile telephone or the like, the sealing plate will be subjected to external pressure, and hence the sealing plate will be required to have sufficient strength to such external pressure.

SUMMARY OF THE INVENTION

It is a first object of the present invention to provide an EL device sealing plate which allows a sufficient joining area to be secured, and hence allows the strength thereof to external pressure to be increased, and a multiple sealing plate-producing mother glass substrate for producing a plurality of such EL device sealing plates.

It is a second object of the present invention to provide an EL device which has sufficient strength to external pressure and is capable of effectively preventing moisture and oxygen from infiltrating into the EL device, thereby having a prolonged life.

To attain the above first object, in a first aspect of the present invention, there is provided a flangeless EL device sealing plate having peripheral projecting parts on an inside of which is defined a recessed part for covering an EL multilayer film that is formed on an EL device substrate, the peripheral projecting parts being joined to the substrate by a joining material, wherein the peripheral projecting parts have a width of not less than a thickness at the peripheral projecting parts, and not less than 0.7 mm.

According to this construction, the width of the peripheral projecting parts of the flangeless EL device sealing plate is not less than the thickness at these peripheral projecting parts, and hence the strength of the EL device sealing plate to external pressure can be increased, and the thickness of the joining material can be reduced. Moreover, the width of the peripheral projecting parts is not less than 0.7 mm, and hence a sufficient joining area can be secured.

Preferably, the peripheral projecting parts have a width of not less than 1.1 mm. As a result, the strength of the EL device sealing plate to external pressure can be further increased, and a yet larger joining area can be secured.

Also preferably, the EL device sealing plate is made of a glass. As a result, the recessed part can be formed easily using an etching method or the like.

More preferably, the recessed part is formed using an etching method. As a result, compared with a sandblasting method, a surface of a base part of the recessed part can be made to be flat more reliably, and hence the strength of the EL device sealing plate to external pressure can be increased, and moreover the thickness of the joining material can be reduced. Moreover, compared with a pressing method, the peripheral projecting parts can be made to be flat more reliably, and hence the thickness of the joining material can be made to be more uniform.

To attain the above first object, in a second aspect of the present invention, there is provided a multiple sealing plate-producing mother glass substrate comprising EL device sealing plates as claimed according to the first aspect, the EL device sealing plates being formed substantially in a matrix shape.

According to this construction, effects the same as those of the EL device sealing plate according to the first aspect can be realized.

To attain the above second object, in a third aspect of the present invention, there is provided an EL device comprising an EL device substrate, an EL multilayer film formed on the substrate, an EL device sealing plate according to the first aspect, and a joining part that joins together the peripheral projecting parts of the EL device sealing plate and the substrate, wherein the joining part has a width of not less than 0.7 mm.

According to this construction, the EL device has an EL device sealing plate according to the first aspect, and hence an EL device having sufficient strength to external pressure can be provided, and moreover a sufficient joining area can be secured. Furthermore, the width of the joining part that joins together the peripheral projecting parts of the EL device sealing plate and the substrate is not less than 0.7 mm, and hence moisture and oxygen can be effectively prevented from infiltrating into the EL device. An EL device having a prolonged life can thus be provided.

Preferably, the joining part has a width of not less than 1.1 mm. As a result, the bonding strength can be increased.

Also preferably, the joining part comprises a curable soft material, and the curable soft material is compressed when joining together the peripheral projecting parts and the substrate. As a result, because the joining part comprises a curable soft material, the peripheral projecting parts and the substrate can be pressed together when being joined together; the curable soft material is thus compressed when joining the peripheral projecting parts and the substrate together, and hence the thickness of the joining part can be reduced.

The above and other objects, features, and advantages of the invention will become more apparent from the following detailed description taken in conjunction with the accompanying drawings.

DETAILED DESCRIPTION OF THE PREFERRED EMBODIMENTS

The present inventors carried out assiduous studies to attain the above objects, and as a result discovered that, in a flangeless EL device sealing plate having peripheral projecting parts on an inside of which is defined a recessed part for covering an EL multilayer film that is formed on an EL device substrate, the peripheral projecting parts being joined to the substrate by a joining material, if the width of the peripheral projecting parts is not less than the thickness at the peripheral projecting parts, and moreover is not less than 0.7 mm, then a sufficient joining area can be secured, and the strength of the EL device sealing plate to external pressure can be increased.

Moreover, the present inventors discovered that in an EL device comprised of an EL device substrate, an EL multilayer film formed on the substrate, a flangeless EL device sealing plate having peripheral projecting parts on an inside of which is defined a recessed part for covering the EL multilayer film, and a joining part that joins together the peripheral projecting parts and the substrate, if the width of the peripheral projecting parts of the EL device sealing plate is not less than the thickness at these peripheral projecting parts and moreover is not less than 0.7 mm, and furthermore the width of the joining part is not less than 0.7 mm, then an EL device which has sufficient strength to external pressure and is capable of effectively preventing moisture and oxygen from infiltrating into the EL device, thereby having a prolonged life can be provided.

The present invention was accomplished based on the above findings.

Embodiments of the present invention will now be described in detail, with reference to the drawings.

Figure 1:
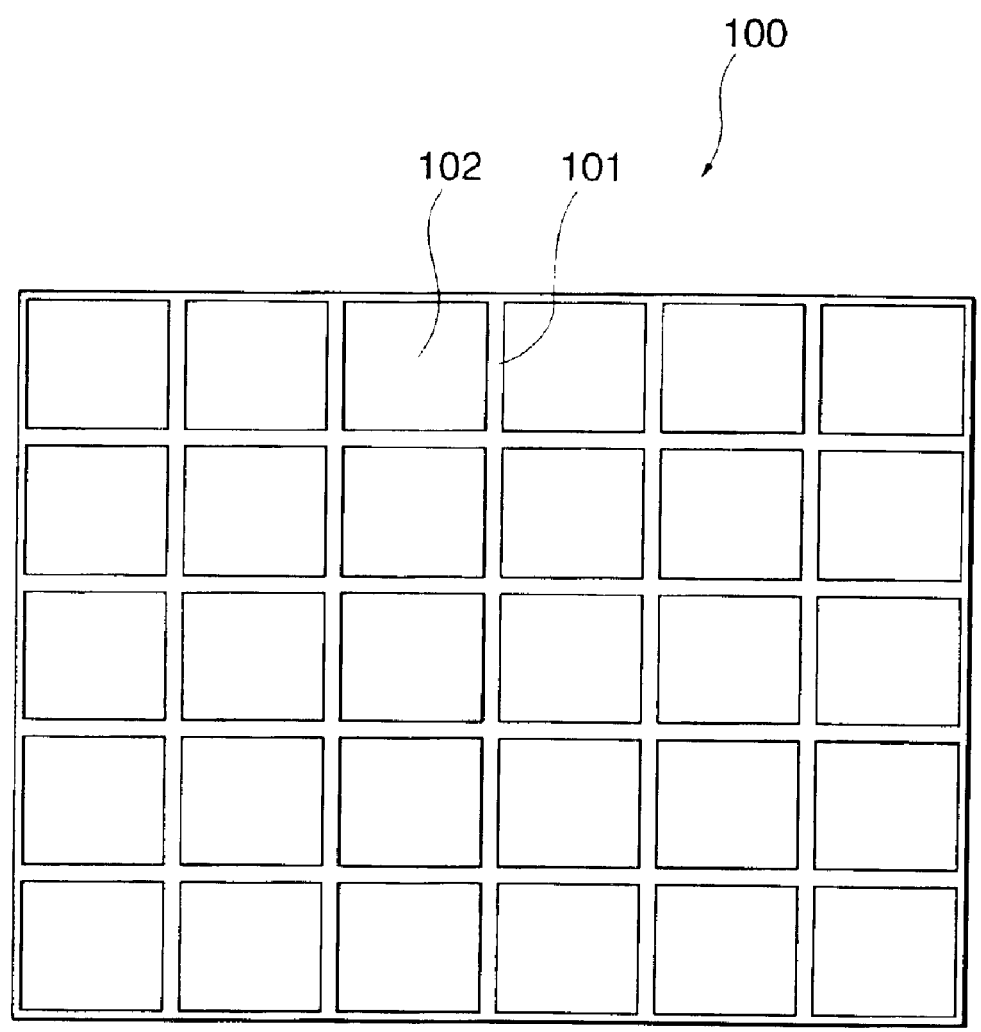
FIG. 1 is a top plan view of a multiple sealing plate-producing mother glass substrate in which EL device sealing plates are formed substantially in a matrix shape, according to an embodiment of the present invention.

FIG. 1 is a top plan view of a multiple sealing plate-producing mother glass substrate in which EL device sealing plates are formed substantially in a matrix shape, according to an embodiment of the present invention.

In FIG. 1, a multiple sealing plate-producing mother glass substrate 100 having a length of 30 cm and a width of 40 cm has glass EL device sealing plates formed therein in a 5×6 matrix shape.

A method of forming such EL device sealing plates in such a 5×6 matrix shape in a starting material glass plate is to remove predetermined parts of the starting material glass plate to form recesses using a sandblasting method, an etching method such as wet etching, or the like.

For example, in the case of wet etching, first an alkali-free glass starting material glass plate is masked using a tape-like resist of width 2.0 mm such that parts of the starting material glass plate that remain exposed form a 5×6 matrix shape. The masked starting material glass plate is then immersed for approximately 10 to 180 minutes in an etching solution comprised of 5 to 50 mass % hydrofluoric acid containing a suitable amount of at least one inorganic acid selected from the group consisting of sulfuric acid, hydrochloric acid, nitric acid, and phosphoric acid, whereby glass is removed from the starting material glass plate to form recessed parts 102 at the exposed parts, leaving behind projecting parts 101 at the masked parts. The starting material glass plate is next washed thoroughly with pure water, and then the resist is stripped off. Note that a surfactant may be added to the etching solution as appropriate. Furthermore, it is preferable for the etching solution to contain one or more organic acid(s) and/or base(s) selected from the group consisting of carboxylic acids, dicarboxylic acids, amines, and amino acids as appropriate.

Because predetermined parts of the starting material glass plate are removed to form recessed parts using a wet etching method as described above, a surface of a base part of the recessed part 102 of each EL device sealing plate can reliably be made to be flat, and hence the strength of the EL device sealing plate to external pressure can be increased.

Next, the multiple sealing plate-producing mother glass substrate 100 in which the recessed parts 102 have been formed in a 5×6 matrix shape as described above is cut along the projecting parts 101 that partition the recessed parts 102 from one another. As a result, 30 (5×6) EL device sealing plates can be obtained.

In the multiple sealing plate-producing mother glass substrate 100 described above, the arrangement of the EL device sealing plates is made to be a matrix shape; however, there is no limitation thereto, but rather any arrangement suitable for producing a plurality of EL device sealing plates from a single mother glass substrate may be adopted.

Moreover, the width of the resist is not limited to being 2.0 mm, but rather may be made to be any width insofar the width of peripheral projecting parts of each of the EL device sealing plates obtained is not less than the thickness at these peripheral projecting parts, and may even be made to be a high value of approximately 1 cm to secure margins for the cutting out of the EL device sealing plates.

According to the multiple sealing plate-producing mother glass substrate 100 shown in FIG. 1, a plurality of EL device sealing plates can be obtained by separation through cutting. Moreover, the strength of the EL device sealing plates to external pressure can be increased. Furthermore, processing of the EL device sealing plates one at a time can be eliminated, and hence the productivity of the manufacture of the EL device sealing plates can be improved.

Figure 2:
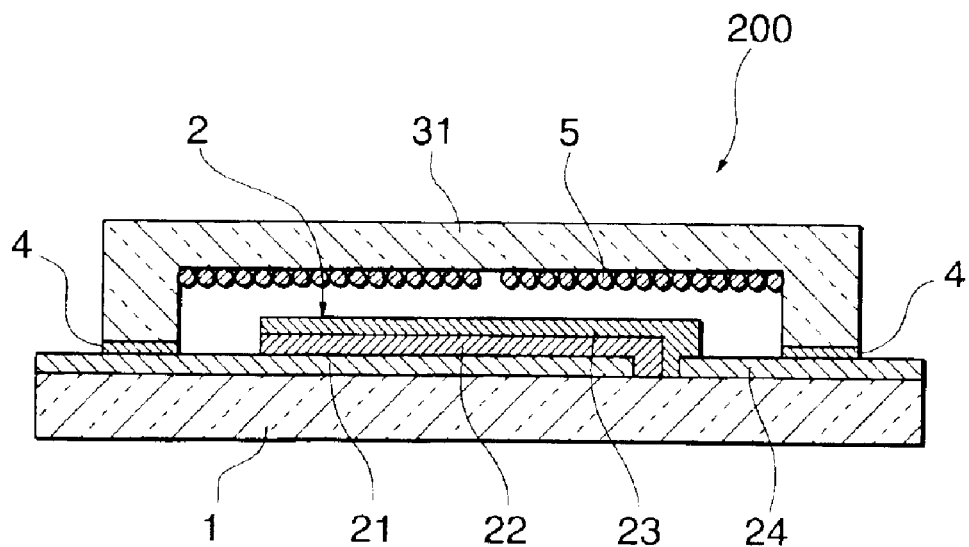
FIG. 2 is a sectional view of an EL device having an EL device sealing plate according to the present embodiment.

FIG. 2 is a sectional view of an EL device having an EL device sealing plate according to the present embodiment.

In FIG. 2, an organic EL device 200 is comprised of a transparent plate-shaped alkali-free glass substrate 1 having a thickness of 0.7 mm, an organic EL multilayer film 2 that is formed on the substrate 1, and an alkali-free glass sealing plate 31 that is bonded onto the substrate 1 using an adhesive 4 so as to cover the organic EL multilayer film 2. The adhesive 4 is made of an ultraviolet curing type epoxy resin or the like.

Figure 5:
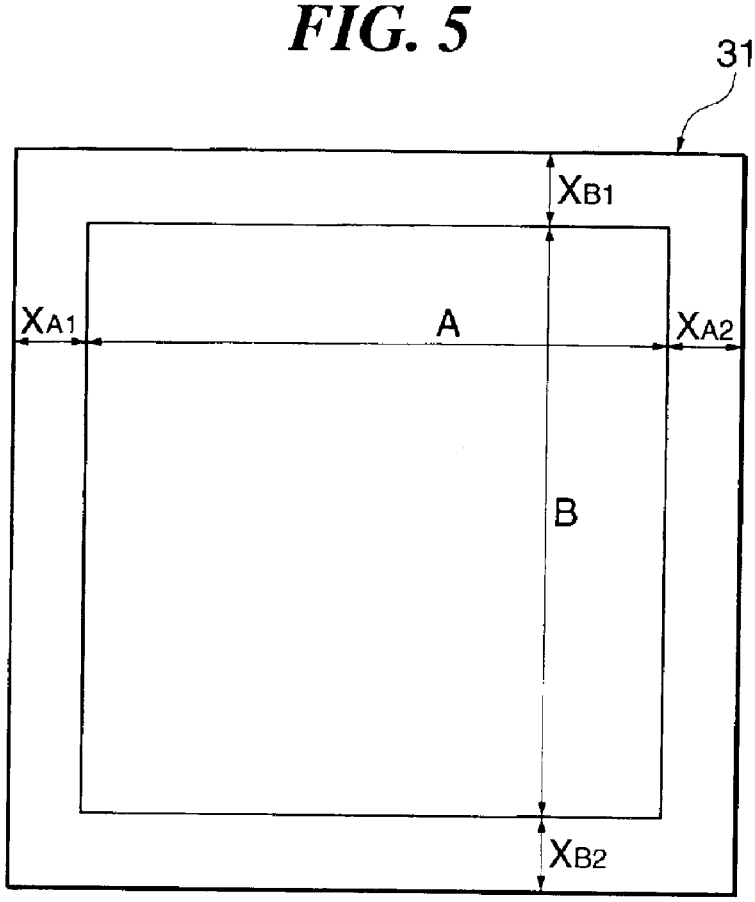
FIG. 5 is a top plan view showing peripheral projecting parts of the EL device sealing plate according to the above-mentioned embodiment.
Figure 6:
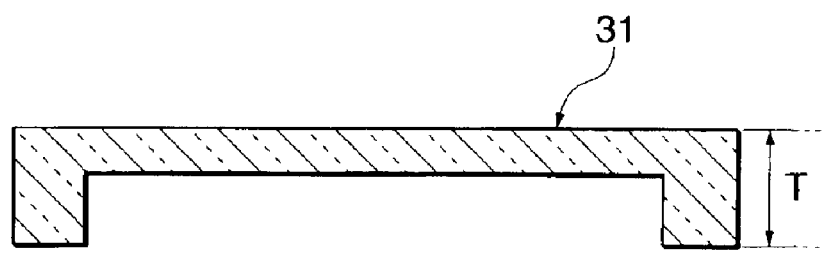
FIG. 6 is a sectional view showing the peripheral projecting parts of the EL device sealing plate according to the present embodiment.

The alkali-free glass sealing plate 31 is produced by being cut out from the multiple sealing plate-producing mother glass substrate 100 shown in FIG. 1, and has a recessed shape that is formed using the wet etching method described above such that, for example, the thickness of a base part is 0.4 mm, the lengths of sides of the base part (A and B in FIG. 5) are each 40 mm, the widths of peripheral projecting parts ($X_{A1}$, $X_{A2}$, $X_{B1}$, and $X_{B2}$ in FIG. 5) are each at least 0.7 mm, and the thickness at the peripheral projecting parts (T in FIG. 6) is 0.7 mm. A molecular sieve powder 5 (made by Union Carbide Corporation) for adsorbing moisture is applied onto the surface of the base part of the sealing plate 31. It is preferable to carry out the application of the molecular sieve powder 5, and the bonding of the sealing plate 31 onto the substrate 1, in a dry environment or under reduced pressure to eliminate the effects of moisture and oxygen.

The organic EL multilayer film 2 is constituted from a transparent conductive film 21 that is formed on the substrate 1, is made of ITO and has a height of 300 nm, an organic EL film 22 that is formed on an upper surface of the transparent conductive film 21, a back electrode 23 that is formed on an upper surface of the organic EL film 22, is made of an Mg—Ag alloy and has a height of 300 nm, and a back electrode extraction electrode 24 that is formed on the substrate 1, is connected to the back electrode 23, is made of ITO and has a height of 300 nm.

The organic EL film 22 is composed of a hole transport layer that is made of triphenyl diamine and has a height of 70 nm, and a light-emitting layer that is made of a quinolinol aluminum complex and has a height of 70 nm, in this order from the transparent conductive film 21 side.

In the present embodiment, the organic EL film 22 is composed of a hole transport layer and a light-emitting layer, but an electron transport layer made of a triazole, an oxadiazole or the like may be further disposed between the back electrode 23 and the light-emitting layer.

Because the sealing plate 31 is of a flangeless type having peripheral projecting parts on the inside of which is defined a recessed part, the sealing plate 31 can be prevented from contacting the organic EL multilayer film 2. The etching depth of the recessed part in the sealing plate 31 is varied as appropriate in accordance with the type and thickness of the organic EL multilayer film 2. As a result, there is room to provide a moisture absorbing agent such as a molecular sieve that adsorbs moisture that has infiltrated into the organic EL device 200 and/or a reducing agent that adsorbs oxygen that has infiltrated into the organic EL device 200.

In the embodiment described above, the alkali-free glass sealing plate 31 is processed into the recessed shape using a wet etching method; possible methods of processing such a glass sealing plate into a recessed shape include not only etching methods such as wet etching, but also a pressing method in which the starting material glass plate itself is bent, and a sandblasting method.

Figure 4:
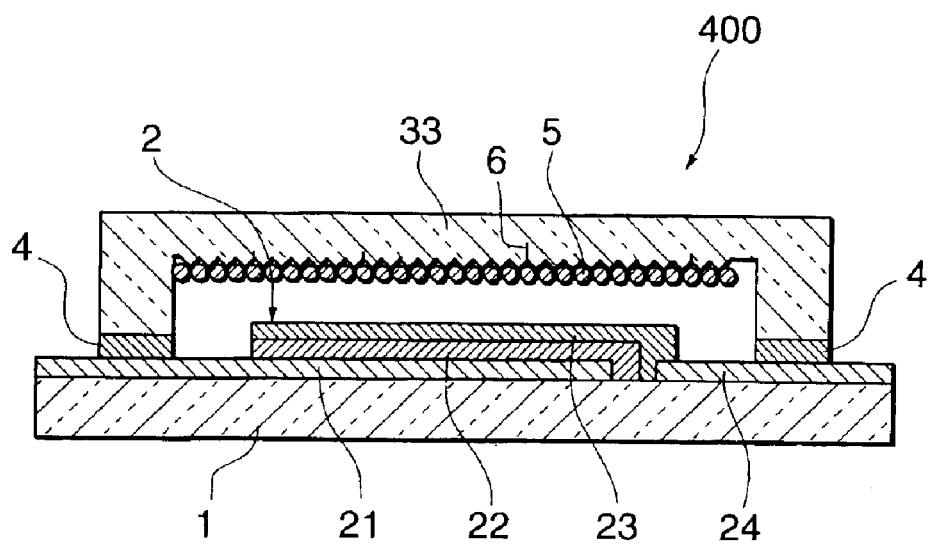
FIG. 4 is a sectional view of an EL device 400 having a sealing plate 33 manufactured using a sandblasting method.

In the case of the sandblasting method, a large number of minute cracks 6 that are inherent in the sandblasting method arise in a surface of a base part of the resulting sealing plate 33 (see FIG. 4), and hence the strength of the base part of the sealing plate 33 drops. Regarding this point, in the case of the etching method, minute cracks do not arise in the surface of the base part of the sealing plate 31, and hence the strength of the base part and the peripheral projecting parts of the sealing plate 31 is excellent; the etching method is thus preferable. Moreover, in the case of the etching method, because the strength of the base part and the peripheral projecting parts of the sealing plate 31 is excellent, an EL device 200 having a long brightness half-life can be provided.

Moreover, possible etching methods include not only wet etching, but also dry etching. With dry etching, the processing is carried out on one sealing plate 31 at a time, and hence, although the etching can be carried out precisely, productivity is poor. On the other hand, with wet etching, if the components of the etching solution and the etching temperature are suitably selected, then it becomes possible to carry out batch processing in which a plurality of sealing plates 31 are etched simultaneously, and hence productivity is good.

The etching solution used in the wet etching method is preferably 5 to 50 mass % hydrofluoric acid to which has been added a suitable amount of at least one inorganic strong acid selected from the group consisting of sulfuric acid, hydrochloric acid, nitric acid, and phosphoric acid. As a result, the etching ability can be increased. Moreover, a surfactant may be added to the etching solution as appropriate.

The components of the etching solution and the concentrations thereof are selected as appropriate in accordance with the temperature of the etching solution, the composition of the glass to be etched, and so on.

In the embodiment described above, the sealing plate 31 is made to be an alkali-free glass sealing plate having formed therein a recessed part such that the thickness at a base part is 0.4 mm and the width of peripheral projecting parts is at least 0.7 mm. However, in accordance with the structure of the organic EL device 200, instead of an alkali-free glass, the sealing plate 31 may be made of a low-alkali glass, a quartz glass, a soda-lime glass or the like. Moreover, the thickness of the base part of the sealing plate 31 is preferably in a range of 0.3 to 1.1 mm. This is because if this thickness is less than 0.3 mm, then the strength of the base part of the sealing plate 31 will be too low, whereas at a thickness of 1.1 mm the strength of the base part of the sealing plate 31 will be sufficiently high. The width of the peripheral projecting parts of the sealing plate 31 is not less than the thickness at the peripheral projecting parts, and moreover is not less than 0.7 mm, preferably not less than 1.1 mm. If the width of the peripheral projecting parts is less than the thickness at the peripheral projecting parts, then the strength of the peripheral projecting parts would be too low, whereas if the width of the peripheral projecting parts is not less than the thickness at the peripheral projecting parts, then the strength of the peripheral projecting parts is sufficiently high to the extent that it is possible to maintain the original strength of the glass. Moreover, if the width of the peripheral projecting parts is not less than 0.7 mm, then a sufficient bonding area for the adhesive 4 can be secured.

In the present embodiment, the EL device sealing plate is made of a glass, but the EL device sealing plate may instead be made of a metal, a resin, or the like.

Moreover, in the present embodiment, the EL film is made to be an organic EL multilayer film 2, but the EL film may be made to be an inorganic EL multilayer film. In this case, the inorganic EL multilayer film is composed of an insulating layer, a light-emitting layer, and an insulating layer, or an electron barrier layer, a light-emitting layer, and a current limiting layer, laminated in this order from the transparent conductive film side.

Furthermore, in the present embodiment, the EL device is made to be an organic EL device 200 having a passive structure. However, an active structure may be adopted instead.

EXAMPLES

First examples of the present invention will now be described.

Alkali-free glass sealing plates 31 each having on an inside part thereof a square recessed part of sides 40 mm and depth 300 μm were prepared from 1.1 mm-thick starting material glass plates using a wet etching method as a recessed part formation method, varying the width of the resist so that the width of the peripheral projecting parts of the sealing plate 31 varied as shown in Table 1; an organic EL device 200 test piece having each sealing plate 31 was then prepared as described earlier with reference to FIG. 2 (Examples 1 to 3, and Comparative Examples 1 and 2, shown in Table 1). The temperature of the etching solution used in the wet etching method was maintained at 25° C. Moreover, when preparing each of the organic EL device 200 test pieces, the pushing pressure on the adhesive 4 was made to be 980 N/m$^2$ (100 kg/m$^2$); the test piece sealing plates 31 were not damaged under this pressure.

The strength of the peripheral projecting parts and the base part of the sealing plate 31 of each of the prepared test pieces was then evaluated. Specifically, an external pushing pressure of 1960 N/m$^2$ (200 kg/m$^2$) was applied to the sealing plate 31 of each of the prepared test pieces, and the strength of the peripheral projecting parts and the base part of the sealing plate 31 was evaluated as "satisfactory" (i.e. no damage occurred) or "unsatisfactory" (i.e. damage occurred).

The evaluation results are shown in Table 1.

TABLE 1

| | Recessed Part Formation Method | Width of Peripheral Projecting Parts [mm] | Strength | |
|---|---|---|---|---|
| | | | Peripheral Projecting Parts | Base Part |
| Example 1 | Wet Etching | 1.6 | Satisfactory | Satisfactory |
| Example 2 | Wet Etching | 1.3 | Satisfactory | Satisfactory |
| Example 3 | Wet Etching | 1.1 | Satisfactory | Satisfactory |
| Comparative Example 1 | Wet Etching | 0.9 | Unsatisfactory | Satisfactory |
| Comparative Example 2 | Wet Etching | 0.7 | Unsatisfactory | Satisfactory |

From Table 1, it can be seen that in the case that the thickness of the starting material glass plate (which corresponds to the thickness of the sealing plate 31 at the peripheral projecting parts thereof) is 1.1 mm, the strength of the sealing plate 31 to an external pushing pressure of 1960 N/m$^2$ is satisfactory if the width of the peripheral projecting parts of the sealing plate 31 is not less than 1.1 mm.

Second examples of the present invention will now be described.

Figure 3:
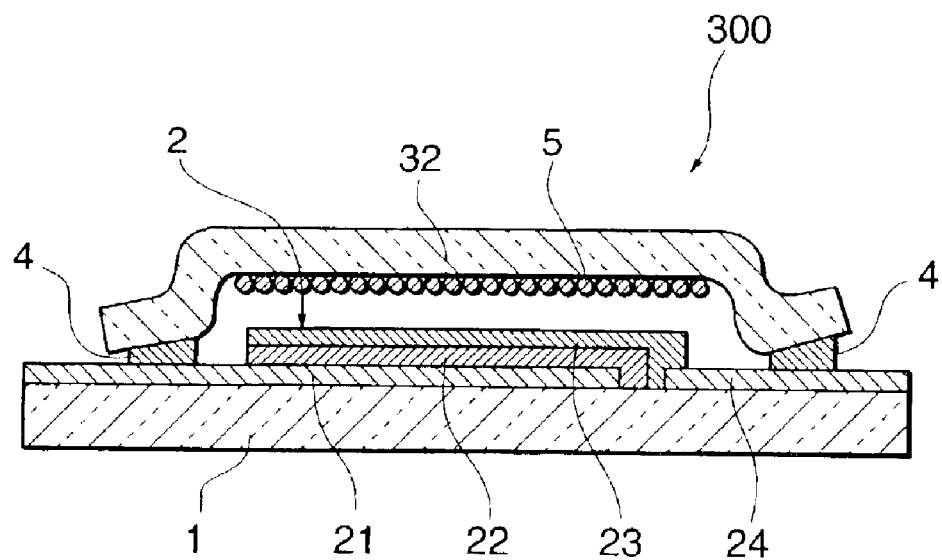
FIG. 3 is a sectional view of an EL device 300 having a sealing plate 32 manufactured using a pressing method.

Sealing plates 33 each having on an inside thereof a square recessed part of sides 40 mm and depth 300 μm were prepared from 1.1 mm-thick starting material glass plates using a sandblasting method as described earlier as the recessed part formation method, varying the width of the resist in the same way as in the first examples so that the width of the peripheral projecting parts of the sealing plate 33 varied as shown in Table 2; an organic EL device 400 test piece having each sealing plate 33 was then prepared (see FIG. 4) (Examples 4 to 6, and Comparative Examples 3 and 4, shown in Table 2). Moreover, a sealing plate 32 was similarly prepared using a pressing method as described earlier as the recessed part formation method, and an organic EL device 300 test piece having this sealing plate 32 was prepared (see FIG. 3) (Comparative Example 5 shown in Table 2). The strength of the sealing plate 32 or 33 of each test piece was then evaluated as "satisfactory" or "unsatisfactory" as in the first examples.

The evaluation results are shown in Table 2.

TABLE 2

| | Recessed Part Formation Method | Width of Peripheral Projecting Parts [mm] | Strength | |
|---|---|---|---|---|
| | | | Peripheral Projecting Parts | Base Part |
| Example 4 | Sandblasting | 1.6 | Satisfactory | Satisfactory |
| Example 5 | Sandblasting | 1.3 | Satisfactory | Satisfactory |
| Example 6 | Sandblasting | 1.1 | Satisfactory | Satisfactory |
| Comparative Example 3 | Sandblasting | 0.9 | Satisfactory | Unsatisfactory |
| Comparative Example 4 | Sandblasting | 0.7 | Satisfactory | Unsatisfactory |
| Comparative Example 5 | Pressing | 2.0* | Unsatisfactory | Unsatisfactory |

*Indicates width of flange parts [mm]

From Table 2, it can be seen that in the case that the sandblasting method is used and the thickness of the starting material glass plate (which corresponds to the thickness of the sealing plate 33 at the peripheral projecting parts thereof) is 1.1 mm, the strength of the sealing plate 33 to an external pushing pressure of 1960 N/m² is satisfactory if the width of the peripheral projecting parts of the sealing plate 33 is not less than 1.1 mm.

Moreover, it can also be seen from Table 2 that in the case that the pressing method is used, because the sealed parts are uneven, the strength of the sealing plate 32 to an external pushing pressure of 1960 N/m² is unsatisfactory even if the width of the flange parts is 2.0 mm.

Comparing the results in Tables 1 and 2, it can be seen that for Comparative Examples 3 and 4, the sealing plate 33 was damaged from the base part thereof, this being because minute cracks 6 inherent in the sandblasting method arose in the surface of the base part of the sealing plate 33, whereas for Comparative Examples 1 and 2, the sealing plate 31 was damaged from the peripheral projecting parts thereof; it can thus be seen that it is more preferable to form the recessed part using the wet etching method.

Moreover, from Tables 1 and 2, it can be seen that if the width of the peripheral projecting parts is not less than 1.1 mm, then the bonding strength for the adhesive 4 can be increased.

Third examples of the present invention will now be described.

Alkali-free glass sealing plates each having on an inside thereof a square recessed part of sides 40 mm and depth 300 μm, and having peripheral projecting parts for which the width of the peripheral projecting parts was in a range of approximately 0.5 to 1.3 times the thickness at the peripheral projecting parts, were prepared from 0.7 mm-thick starting material glass plates using a recessed part formation method as shown in Table 3. A substrate 1 was then bonded to each sealing plate by applying an adhesive 4 made of an ultraviolet curing type epoxy resin onto the peripheral projecting parts of the sealing plate, applying a pushing pressure of 980 N/m² (100 kg/m²) to the adhesive 4 from the substrate 1 side and the sealing plate side, and irradiating with ultraviolet rays, whereby an organic EL device 200, 300 or 400 test piece was prepared (Examples 7 and 8, and Comparative Examples 6 to 11, shown in Table 3).

Specifically, in the case of using wet etching as the recessed part formation method in Table 3, a starting material glass plate was masked using a tape-like resist of width 1.4, 1.0, 0.9, 0.83, 0.7 or 0.6 mm (taking account that sideways etching would take place and hence the width of the peripheral projecting parts formed would be less than the width of the resist used), and then the masked starting material glass plate was immersed for approximately 60 minutes in an etching solution that was comprised of 20 mass % hydrofluoric acid containing 1.0 mass % sodium dodecylbenzenesulfonate and was maintained at 25° C., thus removing glass from the starting material glass plate to form a recessed part 102 while leaving behind projecting parts 101. The starting material glass plate was then washed thoroughly with pure water, and then the resist was stripped off, thus preparing a sealing plate 31 having peripheral projecting parts having a width in a range of approximately 0.5 to 1.3 times the thickness of the starting material glass plate. An organic EL device 200 test piece was then prepared using the sealing plate 31 as described earlier. Due to the sideways etching, the width of the peripheral projecting parts of the sealing plate 31 became 1.1, 0.7, 0.6, 0.53, 0.4 or 0.3 mm (Examples 7 and 8 and Comparative Examples 6 to 9 respectively). The pushing pressure on the adhesive 4 was made to be 980 N/m²; the test piece sealing plates 31 were not damaged under this pressure.

Moreover, in the case of using pressing as the recessed part formation method in Table 3, a pushing pressure was not applied to the adhesive 4 when preparing the organic EL device 300 test piece sealed with the sealing plate 32.

Furthermore, in the case of using sandblasting as the recessed part formation method in Table 3, the pushing pressure applied to the adhesive 4 was made to be 490 N/m² when preparing the organic EL device 400 test piece sealed with the sealing plate 33, this being because the sealing plate 33 was damaged when the pushing pressure applied to the adhesive 4 was made to be 980 N/m².

The strength of the sealing plate and the lifetime were then evaluated for each organic EL device 200, 300 or 400 test piece prepared. Specifically, each organic EL device 200, 300 or 400 test piece was continuously driven at a driving current of 10 mA/cm² with an initial driving voltage of 8V while applying an external pushing pressure of 490 N/m² to a 2 cm×2 cm region in a central part of the sealing plate of the test piece, and the increase in the driving voltage was evaluated. Moreover, for Examples 7 and 8 and Comparative Examples 7, 10 and 11, the brightness half-life was also measured.

The increase in the driving voltage shown in Table 3 is the amount by which the driving voltage had to be increased to maintain the brightness of the organic EL device 200, 300 or 400 test piece; this increase was evaluated as being "large" in the case of being 20V or more, and "small" in the case of being less than 20V.

The results are shown in Table 3.

TABLE 3

| | Recessed Part Formation Method | Width of Peripheral Projecting Parts [mm] | Increase in Driving Voltage | Brightness Half-Life |
|---|---|---|---|---|
| Example 7 | Wet Etching | 1.1 | 12 V | 6000 hr |
| Example 8 | Wet Etching | 0.7 | 12 V | 6000 hr |
| Comparative Example 6 | Wet Etching | 0.6 | >20 V | |
| Comparative Example 7 | Wet Etching | 0.53 | >20 V | 3000 hr |
| Comparative Example 8 | Wet Etching | 0.4 | >20 V | |
| Comparative Example 9 | Wet Etching | 0.3 | >20 V | |
| Comparative Example 10 | Sandblasting | 0.53 | >20 V | 2500 hr |
| Comparative Example 11 | Pressing | 0.53 | >20 V | 2000 hr |

From Table 3, it can be seen that in the case that the thickness of the starting material glass plate (which corresponds to the thickness of the sealing plate at the peripheral projecting parts thereof) is 0.7 mm, if the wet etching method is used and the width of the peripheral projecting parts of the sealing plate 31 is not less than 0.7 mm, i.e. not less than 1.0 times the thickness at the peripheral projecting parts, then the brightness of an organic EL device 200 having the sealing plate 31 can be maintained for a prolonged time period.

Fourth examples of the present invention will now be described.

Alkali-free glass sealing plates each having on an inside part thereof a square recessed part of sides 40 mm and depth 300 μm, and having peripheral projecting parts for which the width of the peripheral projecting parts was in a range of approximately 0.5 to 1.6 times the thickness at the peripheral projecting parts, were prepared as in the third examples, but this time from 1.1 mm-thick starting material glass plates. An organic EL device 200, 300 or 400 test piece having each sealing plate was then prepared (Examples 9 and 10, and Comparative Examples 12 to 17, shown in Table 4).

As in the third examples, the increase in the driving voltage was evaluated for each organic EL device 200, 300 or 400 test piece; moreover, for Examples 9 and 10 and Comparative Examples 13, 16 and 17, the brightness half-life was also measured.

The measurement results are shown in Table 4.

TABLE 4

|  | Recessed Part Formation Method | Width of Peripheral Projecting Parts [mm] | Increase in Driving Voltage | Brightness Half-Life |
|---|---|---|---|---|
| Example 9 | Wet Etching | 1.65 | 12 V | 6000 hr |
| Example 10 | Wet Etching | 1.10 | 12 V | 6000 hr |
| Comparative Example 12 | Wet Etching | 0.95 | >20 V |  |
| Comparative Example 13 | Wet Etching | 0.83 | >20 V | 3000 hr |
| Comparative Example 14 | Wet Etching | 0.70 | >20 V |  |
| Comparative Example 15 | Wet Etching | 0.55 | >20 V |  |
| Comparative Example 16 | Sandblasting | 0.83 | >20 V | 2500 hr |
| Comparative Example 17 | Pressing | 0.83 | >20 V | 2000 hr |

From Table 4, it can be seen that in the case that the thickness of the starting material glass plate (which corresponds to the thickness of the sealing plate at the peripheral projecting parts thereof) is 1.1 mm, if the wet etching method is used and the width of the peripheral projecting parts of the sealing plate 31 is not less than 1.1 mm, i.e. not less than 1.0 times the thickness at the peripheral projecting parts, then the brightness of an organic EL device 200 having the sealing plate 31 can be maintained for a prolonged time period.

What is claimed is:

1. A flangeless EL device sealing plate having peripheral projecting parts on an inside of which is defined a recessed part for covering an EL multilayer film that is formed on an EL device substrate, said peripheral projecting parts being joined to the substrate at a substantially flat joining surface of said substrate by a joining material;

wherein said peripheral projecting parts have a width as a dimension thereof in a direction parallel to the joining surface and a thickness as a dimension thereof in a direction perpendicular to the joining surface, wherein the width is not less than the thickness, and not less than 0.7 mm, and wherein the recessed part is formed using an etching method.

2. An EL device sealing plate as claimed in claim 1, wherein said peripheral projecting parts have a width of not less than 1.1 mm.

3. An EL device sealing plate as claimed in claim 1, wherein the EL device sealing plate is made of a glass.

4. A multiple sealing plate-producing mother glass substrate comprising EL device sealing plates as claimed in claim 1, said EL device sealing plates being formed substantially in a matrix shape.

5. An EL device comprising:

an EL device substrate;

an EL multilayer film formed on said substrate;

an EL device sealing plate as claimed in claim 1; and a joining part that joins together the peripheral projecting parts of said EL device sealing plate and said substrate;

wherein said joining part has a width of not less than 0.7 mm.

6. An EL device as claimed in claim 5, wherein said joining part has a width of not less than 1.1 mm.

7. An EL device as claimed in claim 5, wherein said joining part comprises a curable soft material, and said curable soft material is compressed when joining together said peripheral projecting parts and said substrate.

* * * * *